US005349668A

United States Patent [19]
Gladstein et al.

[11] Patent Number: 5,349,668
[45] Date of Patent: Sep. 20, 1994

[54] BATTERY OPERATED COMPUTER HAVING IMPROVED BATTERY MONITOR AND CELL REVERSAL PROTECTION CIRCUIT

[75] Inventors: Leo A. Gladstein, Boca Raton, Fla.; Christopher Dave Jones; James C. Wulf, both of Georgetown, Ky.

[73] Assignee: International Business Machines, Armonk, N.Y.

[21] Appl. No.: 869,411

[22] Filed: Apr. 15, 1992

[51] Int. Cl.⁵ ............................................. G06F 1/28
[52] U.S. Cl. .................................. 395/750; 364/707;
    364/DIG. 1; 364/273.1; 364/273.4
[58] Field of Search ..................... 395/750; 364/707

[56]        References Cited
        U.S. PATENT DOCUMENTS

| | | | |
|---|---|---|---|
| 4,907,150 | 3/1990 | Arroyo et al. | 395/575 |
| 4,980,836 | 12/1990 | Carter et al. | 364/483 |
| 5,148,546 | 9/1992 | Blodgett | 395/750 |
| 5,151,855 | 9/1992 | Gray et al. | 395/750 |
| 5,167,024 | 11/1992 | Smith et al. | 395/750 |
| 5,182,810 | 1/1993 | Bartling et al. | 395/750 |
| 5,193,176 | 3/1993 | Brandin | 395/575 |
| 5,230,074 | 7/1993 | Canova, Jr. et al. | 395/750 |

*Primary Examiner*—Debra A. Chun
*Attorney, Agent, or Firm*—George E. Grosser; Douglas R. McKechnie

[57]        ABSTRACT

A battery operated computer includes a battery having a plurality of serially connected banks of battery cells that are monitored during operation of the computer to detect a nearly depleted battery bank and a fully depleted battery bank. The computer also includes a plurality of microprocessors including a host or system processor, a service processor and a power subsystem processor. When a nearly depleted battery bank is detected, the power subsystem processor is interrupted and it sends a message to the service processor which in turn interrupts the host processor. An interrupt handler then powers down the system. When a fully depleted battery bank is detected, the battery is immediately disconnected and the system is shutoff to prevent polarity or cell reversal.

11 Claims, 6 Drawing Sheets

BATTERY OPERATED COMPUTER HAVING IMPROVED BATTERY MONITOR AND CELL REVERSAL PROTECTION CIRCUIT

FIELD OF THE INVENTION

This invention relates to the field of portable, battery operated computers. More specifically, the invention relates to improvements in accurately monitoring a battery, providing a signal when the battery charge is near depletion, and shutting off the computer to prevent cell or polarity reversal.

RELATED APPLICATIONS

The following applications are related:
(1) (1) Application Ser. No. 07/779,486, filed Oct. 18, 1991, by Alfonso et al, for "PEN BASED COMPUTER".
(2) Application Ser. No. 07/870,124, filed Oct. 16, 1992, by C. D. Jones et al, for "A SYSTEM FOR DISTRIBUTED POWER MANAGEMENT IN PORTABLE COMPUTERS".
(3) Application Ser. No. 07/869,278, filed concurrently herewith, by K. Kannan et al, for "SYSTEM TO SERVICE PROCESSOR INTERFACE FOR A TABLET COMPUTER".
(4) Application Ser. No. 07/869,403, filed concurrently herewith, by L. Gladstein et al, for "BATTERY OPERATED COMPUTER HAVING IMPROVED BATTERY GAUGE AND SYSTEM FOR MEASURING BATTERY CHARGE".

BACKGROUND OF THE INVENTION

A digitizer tablet computer has been designed which uses a rechargeable battery as the primary power source allowing a user to carry the computer about from place to place and conduct different transactions. Thus, one of the main objectives of such design was to prolong the useful life of the battery as much as possible by using power management techniques disclosed in the above related application (2), and by accurately measuring the power status of the battery and accurately indicating to the user how much time remains before the battery will be fully depleted. Such indication thereby not only allows the user to save any critical current data but also to use the computer as long as possible before the battery becomes depleted and has to be recharged or replaced with a charged battery.

The digitizer tablet computer was also designed to use a nickel-cadmium (nicad) battery pack as a power source since such type of battery has a number of well known advantages. The battery pack has a plurality of serially connected battery cells which, as the battery packs discharges during operation, provide a voltage that decreases gradually from a fully charged condition until the battery nears depletion whereupon the voltage decreases relatively rapidly. It is desirable to provide the user with information on battery life and allow the user to voluntarily save files and data before the possibility of loss occurs. To this end, a battery gauge is provided which is the subject of the above related application (4). The present invention is directed to accurately monitoring the battery voltage and automatically shutting the computer down when the battery is nearly depleted or when cell polarity reversal is eminent.

SUMMARY OF THE INVENTION

In accordance with one feature of the invention, the battery pack includes a plurality of battery banks. A battery monitor is connected across each bank and monitors the voltage across each bank. The computer can be used as long as the bank voltage across each bank is above a predetermined level or value. Such value is predetermined to be at a point when there is substantially only sufficient remaining battery capacity to allow the computer to store operating data in a non-volatile memory and power down most components. Thus, when the battery monitor detects that the voltage across any one of the banks is at such level, the computer automatically saves the data and shuts down under program control.

It is publicly known that when a multiple cell nicad battery is discharged, differences in the residual capacity of series connected cells may cause one cell to be fully depleted sooner than other cells with the result such cell becomes over-discharged and its polarity is reversed. A nicad battery cell is susceptible to damage or destruction if polarity reversal occurs. Thus, in accordance with another feature of the invention, a cell reversal protection mechanism is provided that operates in association with the battery monitor to disconnect the battery when polarity reversal becomes eminent. When the voltage across any one of the battery banks reaches a discharge end voltage, at which point the battery bank is fully depleted and has no residual capacity, the monitor generates a signal that immediately disconnects the battery.

In accordance with another feature of the invention, the cell reversal protection is a backup to the software controlled shutdown so that in the event the controlled shutdown does not occur at all or quickly enough before polarity reversal becomes eminent, the cell protection circuits override the controlled shutdown and disconnect the battery.

DRAWINGS

Other objects and advantages of the invention will be apparent from the following description taken in connection with the accompanying drawings wherein.

DETAILED DESCRIPTION

The following description is divided into sections that proceed from a more generalized description of the digitizer tablet computer, through a general description of service processor operations, and finally to specific descriptions of the battery monitor and cell reversal protection.

DIGITIZER TABLET COMPUTER

Figure 1:
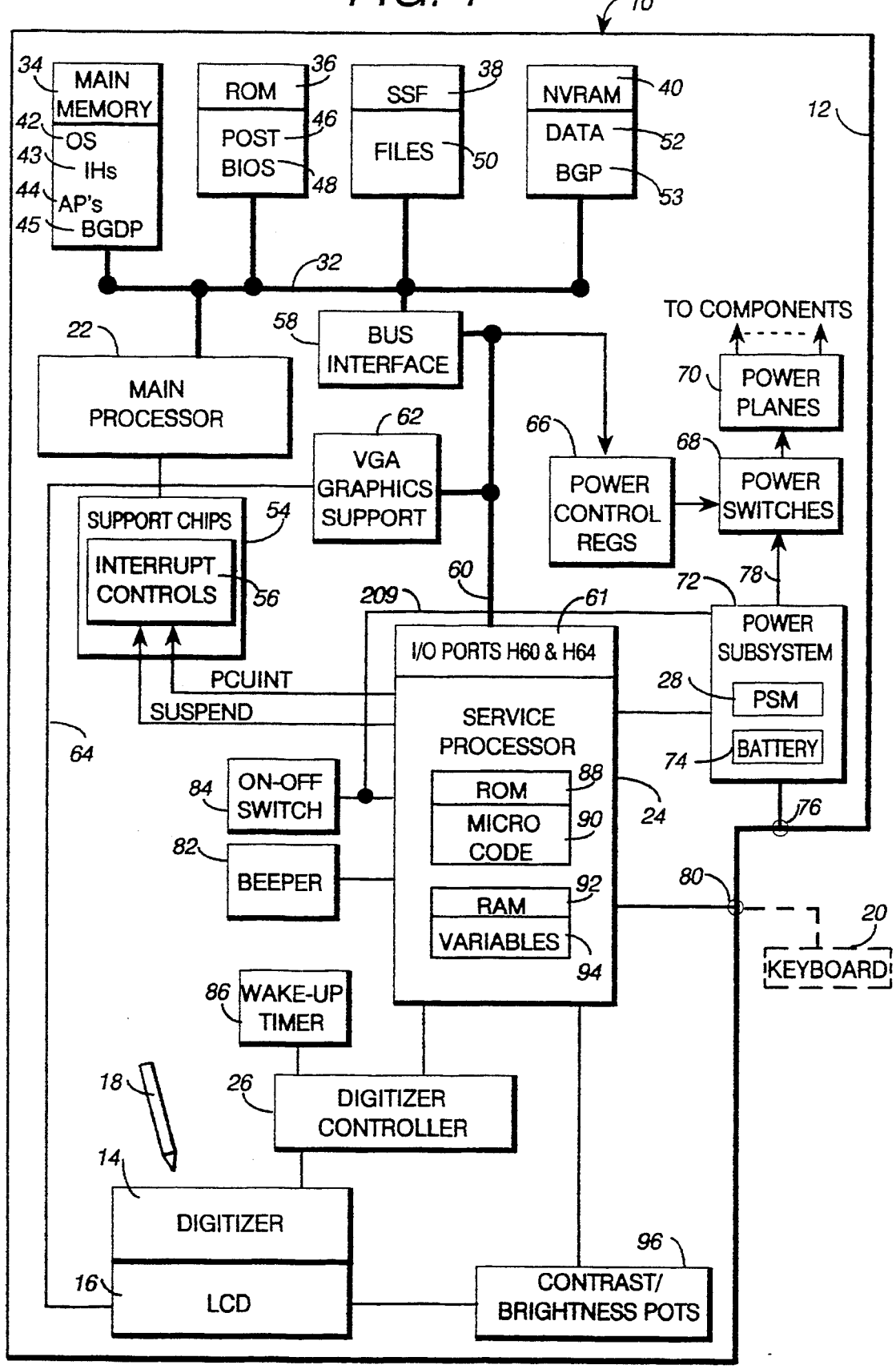
FIG. 1 is a schematic diagram of a digitizer tablet computer embodying the invention.

Referring now to the drawings, and first to FIG. 1, reference numeral 10 denotes a digitizer tablet computer (DTC) that includes a casing 12 for housing the various components of the computer. DTC 10 has a size and a weight that permit a user to readily carry computer 10 from place to place. Housing or casing 12 may have an appearance such as that covered by the above-mentioned related design patent application. DTC 10 includes a digitizer 14 mounted beneath a backlighted liquid crystal display (LCD) 16, and pen or stylus 18 that form the primary input/output means for entering information into and getting information out of the computer. DTC 10 also includes means for connection to other I/O devices for use at locations where it is convenient to do so. For example, an optional keyboard 20 may be used at a home or office location but not out in the field. Computer 10 may also include system I/O (not shown) such as a SCSI diskette port, a parallel port, an RS 232 serial port, and a data/facsimile modem with an RJ11 connector.

Stylus 18 is the primary input device and is battery operated, cordless, inkless pen or stylus 18 which includes a movable tip that closes a switch (elements not shown) when brought into contact with the upper surface of the LCD. Stylus 18 generates a magnetic field that is sensed or picked up by digitizer 14 and translated into signals representing X,Y coordinates indicative of pen position or location. The field is weaker when the switch is open and stronger when the switch is closed so the digitizer can distinguish between "proximity" coordinates and "pen down" coordinates. Computer 10 then operates the LCD, in a manner described in more detail hereinafter, to activate pixels close to the pen position so that the user perceives that he or she is actually writing with the pen. As a result of this mode of input, the system may also be referred as a pen computer. Digitizer 14 includes a sensing mechanism (not shown) having a grid of conductive loops. Loop currents are induced by the magnetic field of the stylus and vary dependent upon the stylus position. The currents are analog and converted to digital values and analyzed by digitizer controller 26 which deduces the stylus position based on the distribution of currents in the loops. It sends the stylus coordinates to routine 104 for transmission to the service and host processors.

DTC 10 includes four different programmable digital microprocessors or microcontrollers comprising a host or main processor 22, a service processor (SP) 24, a digitizer controller 26, and a power subsystem microcontroller (PSM) 28, which perform various distributed functions or operations in a manner discussed in more detail hereinafter. Processors 22, 24, 26, and 28 are preferably respectively implemented with the following commercially available modules: an Intel 80386SX microprocessor, a National Semiconductor HPC 460C4 high performance microcontroller, an NEC 78C10 digitizer controller, and a Signetics 87C752 microcontroller.

Main processor 22 is connected by a local bus 32 to a main memory 34, a read only memory (ROM) 36, a solid state file (SSF) 38, and a non-volatile random access memory (NVRAM) 40. Main memory 34 is implemented as a dynamic random access memory (DRAM), and provides volatile storage of an operating system (OS) 42 and application programs (Aps) 44, such programs being executable by processor 22. OS 42 includes interrupt handlers (Ihs) 43. Aps 44 includes a battery gauge display program (BGDP) 45 that receives battery gauge information and displays it on LCD 16. ROM 36 permanently stores programs such as a power-on self test (POST) program 46 and a basic I/O services (BIOS) 48. SSF 38 operates with low power consumption relative to a hard disk and stores files 50 of the type typically stored on a hard disk. For example, OS 42 and Aps 44 are also stored therein and loaded therefrom into main memory for execution from main memory 34. NVRAM 40 may be implemented in CMOS technology and includes a lithium battery (not shown). Thus the data 52 stored in 40 is not lost when battery 74 is removed or fully discharged. Data 52 includes battery gauge parameters (BGP) 53.

Main processor 22 is also connected to a plurality of commercially available support chips 54 which include interrupt controls 56. While controls 56 handle other interrupts commonly directed to processor 22 (the details not being germane to the invention), controls 56 receive from SP 24 two interrupts PCUINT and SUSPEND, the latter interrupt being effective to interrupt the main processor and produce a software controlled power down sequence as described in the related application (2) above.

Local bus 32 is connected through a buffer or bus interface 58 to a bus 60 which is connected to service processor 24 through I/O ports 61, to VGA graphics support 62 and to power control registers (REGS) 66. Such busses and buffer connect the main processor to such elements whereby the main processor controls the operation of LCD 16 and the distribution of power through the settings of regs 66, and operates support processor 24 as a slave device in a manner described in more detail hereinafter. VGA graphics support 62 is connected by line 64 to LCD 16. The various screens presented on LCD 16, including the "writing" produced by stylus 18, are thus controlled by the main processor.

A power distribution system includes power control regs 66 that are connected to and control the opening and closing of power switches 68 which receive power over bus 78 from a power subsystem (PS) 72 and selectively deliver such power to power planes 70. The various components of the system are respectively connected to different ones of planes 70. Power subsystem 72 includes PSM 28 and a rechargeable, nickel/cadmium battery 74. Power subsystem 72 is also connected to a connector 76 for receiving an adapter (not shown) that provides DC power from an external source for charging the battery and operating the computer. The source may be a car battery through a cigarette lighter adapter, or an AC source through an AC to DC adapter. When the adapter is plugged in, DTC 10 operates under external power and battery 74 is charged if needed. Power control regs 66 are connected to bus 60 and are addressable so that host processor 22 can selectively set the registers to control or turn switches 68 on and off and execute power up and power down sequences for power management operations.

SERVICE PROCESSOR

Service processor 24 is connected to a connector 80 which allows a keyboard 20 to be attached to computer 10 and operated under the control of the service processor. Processor 24 is also connected to a speaker or beeper 82 and an on/off switch 84. Beeper 82 operates under the control of processor 24 and produces an alarm sound indicating when the charge in battery 74 is low. Switch 84 is user operated and provides the means for selectively turning computer 10 on and off and causing different events to occur dependent upon the power states and status of the computer. Computer 10 has four power states, namely, normal power, idle power, sleep power and zero power states. The action of switch 84 is part of a power management facility incorporated into computer 10 to extend the battery time of operation of computer 10. Such facility is described in more detail in the above mentioned related application (2) and operates in such fashion that clock rates may be changed and the entire system put into a sleep state when inactive to conserve power and various sections of the logic and I/O devices may be powered off when not in use.

Service processor 24 includes a ROM 88 for storing microcode 90 and a RAM 92 for storing variables 94 generated and used while the microcode routines are executed by processor 24. Also connected to processor 24 are potentiometer or pots 96 for controlling brightness and contrast in LCD 16.

SP 24 controls keyboard 20, digitizer 14, system buttons comprising switch 84 and pots 96, and power subsystem 78. SP 24 interfaces with the host processor over bus 60 via a standard PS/2 keyboard controller interface modified to support the digitizer and power subsystem but not supporting a mouse. SP 24 interfaces with host processor 22 through a PS/2 keyboard interface as more fully described in the above related application (3), with keyboard 20 over a standard PS/2 keyboard interface, with digitizer 16 over an interrupt driven serial interface, and with power subsystem 78 over a polled serial interface similar to the keyboard interface. Main processor 22 offloads to SP 24 much of the I/O intensive processing needed to manage the keyboard, digitizer and power subsystem interfaces. SP 24 also assists the host processor with power management and supervises the system while the main processor is sleeping.

Figure 2:
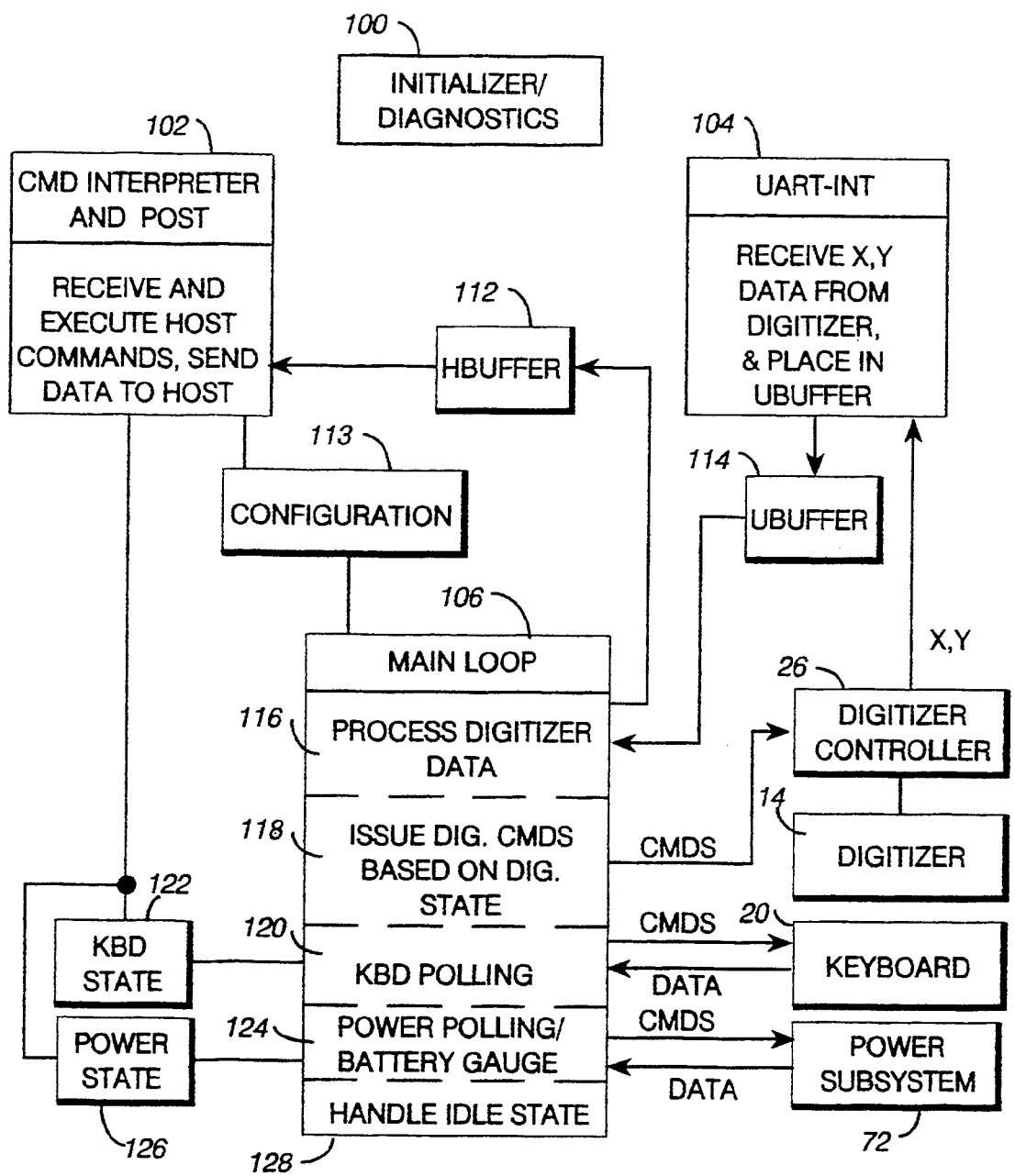
FIG. 2 is a schematic diagram illustrating interaction between hardware and microcode routines in a support processor shown in FIG. 1.

FIG. 2 illustrates service processor routines defined by microcode 90 and related hardware. The routines are illustrated in boxes having uniform line widths, while the hardware is illustrated in shadowed boxes. Such routines include an initializer/diagnostics 100, a command interpreter and post 102, a UART-interrupt (INT) 104, and a main loop 106, routines. The general operation of the various routines will now be described. Initializer and diagnostic routine 100 is performed when the computer is initially turned on from a zero power state. The routine initializes various components and performs power-on diagnostics. Upon successful completion thereof, DTC 10 is set to its normal power state where full operations can proceed. Routine 102 receives, interprets and executes host commands, handles host data that must be sent to the keyboard, and transmits or posts data between the SP and the host. Such data includes digitizer data from HBUFFER 112, configuration data from configuration register 113, and keyboard and power state data from registers 122 and 126.

UART-INT routine 104 receives information (X,Y coordinates or command responses) from digitizer controller 26 and stores them in UBUFFER 114 for later processing by a process digitizer data routine 116 in main loop 106. Main loop routine 106 performs background processing and loops through a series of routines 116, 118, 120, 124, and 128. Routines 116 formats and filters the digitizer coordinates and places the results in HBUFFER 112 for transmission to the host computer. Routine 118 issues various digitizer routines based on the state of the digitizer. Routine 128 does any state transition processing required to switch between states when entering and exiting idle mode. Routine 120 is a keyboard polling loop that monitors a keyboard interface clock (not shown) and receives keyboard data including scan codes and command response data. Lastly, routine 124 is a power polling loop that monitors a power interface clock (not shown) and receives power subsystem data over a serial link, such data including power packets described in detail below. Routine 124 transfers or clocks in data using a power clock generated by PSM 28. Routine 124 also functions as part of a battery gauge that indicates how much energy remains in battery 74 and how much time remains until the battery charge is depleted. Further details of the battery gauge operation are set forth in related application (4).

SP 24 polls power subsystem (PS) 72 in step 140 in response to which SP 24 receives from PS 72 in step 142 PS data or information in the form of a data packet. The polling occurs repetitively about every 250 milliseconds. Each data packet is eight bytes long. In response to the first poll after system power up, the data packet contains information indicating that the battery was changed while the machine was off, and any cumulative charge added to the battery while the computer was off. While computer 10 is on, the PSM sends periodic information packets to SP. Each packet contains information on battery voltage, battery load, and the amount of charge added since last poll. Each packet also contains flags for indicating various conditions, the flags including two bits designated ICMAINBD and ICMAINWN. These two bits are derived from the signals -EM and WARNNOT which are sampled by PSM 28 and passed on to SP 24 to indicate the state of the battery as follows:

| ICMAINBD | ICMAINWN | DESCRIPTION/STATE |
| --- | --- | --- |
| 0 | 0 | Battery voltage above warning level. |
| 0 | 1 | Battery close to empty. |
| 1 | 0 | Not possible unless hardware problem. |
| 1 | 1 | Battery depleted (not usable). |

SP 24 uses algorithms described in the above related application (4) to obtain an indication of when the battery is close to being empty.

POWER SUBSYSTEM

Figure 3:
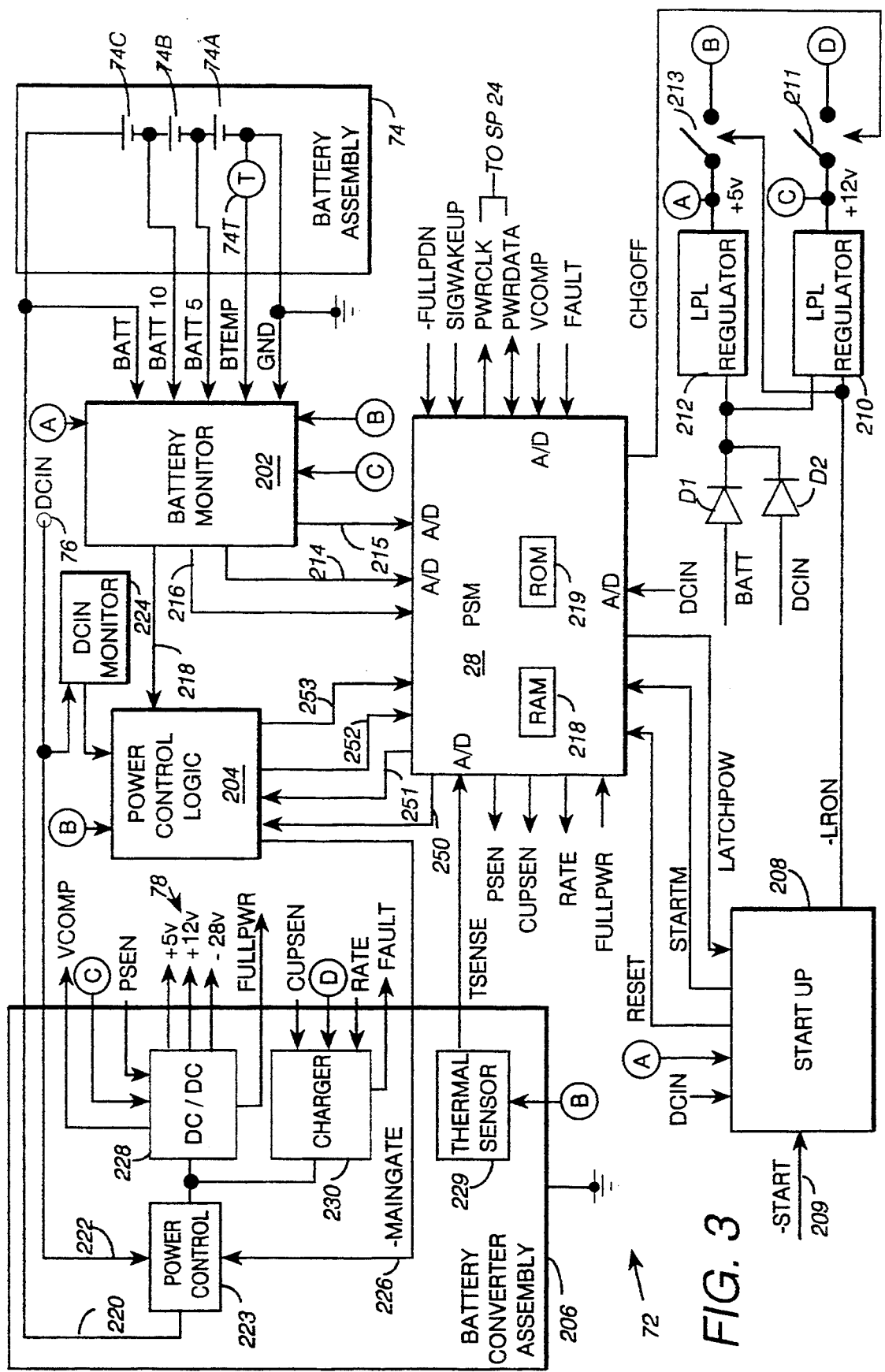
FIG. 3 is a block diagram showing further details of the power subsystem shown in FIG. 1.

Referring to FIG. 3, power subsystem 72 includes PSM 28 and battery 74 as previously described. PS 72 further includes a battery monitor 202, power control logic 204, a battery converter assembly 206, and start-up control 208. When the on-off switch 84 (FIG. 1) is pressed by a user, a -START signal is fed on line 209 to start up 208 which generates two signals STARTM and -LRON. STARTM is produced whenever switch 84 is pressed by a user and a power source (battery or external) is present. -LRON is produced when switch 84 is pressed or when an external power source (DCIN) is introduced or when a fresh battery is placed in computer 10. -LRON generates a RESET signal that is fed to PSM 28 and monitor 202. PSM 28 generates a LATCHPOW signal that is fed back to start up 208 so that -LRON continues to be active after switch 84 is released. -LRON is also transmitted from 208 to a low power linear (LPL) regulator 210 and provides a control signal to a switch 213 connected to the output of LPL regulator 212. DCIN and BATT signals are fed respectively to two diodes D1 and D2 whose outputs are both connected to regulators 210 and 212. These regulators produce +5 v and +12 v signals which are supplied to switches 211 and 213 and to different components shown in FIG. 3. To simplify the drawing, some of the lines have been omitted and the connections are made between the various ports defined by letters within circles. Switch 211 is controlled by a CHGOFF signal from PSM 28 to shut the charger off. Switch 211 when closed transmits the output of regulator 210 to charger 230 through circles D. The output of regulator 212 is transmitted directly to switch 213 and to monitor 202 through circles A. Switch 213 is controlled by the -LRON signal and is connected to sensor 229 through circles B to supply power thereto.

Battery 74 is preferably in the form of a battery pack comprising fifteen nicad cells connected in series. The cells have substantially identical capacities and are arranged in three banks 74A, 74B, and 74C of five cells each. The three banks are connected in series and the five cells in each bank are connected in series. The banks are connected to monitor 202 thereby providing the monitor with voltages BATT5 from bank 74A, BATT10 from bank 74B, and BATT from bank 74C. In addition, a ground line GND is fed into monitor 202. Also, battery 74 includes a thermistor 74T the resistance of which is indicative of battery temperature. Battery monitor 202 monitors the three banks or groups of five battery cells for two purposes: extended use of battery energy, and cell reversal protection in a manner discussed in more detail below. Monitor 202 is connected to PSM 28 by two lines 214 and 215 and transmits on such lines signals representing the battery voltage and battery temperature. The battery temperature is obtained by measuring the resistance of thermistor 74T and converting it to a corresponding temperature value. Such signals are inputted into PSM 28 through analog-to-digital (A/D) ports and stored in RAM 218. In accordance with the invention, monitor 202 also generates a battery warning signal WARNNOT when the monitor detects that a bank has dropped below 5.50 volts DC, and transmits such signal to PSM 28 on line 216. Such signal interrupts PSM 28 which then informs the service processor which then sends the SUSPEND interrupt request to the processor. Monitor 202 also generates an emergency shutoff signal -EM signal when the voltage from any battery bank 74 A, B, or C drops below 5.0 volts DC. Such signal is transmitted to power control logic 204 on line 218 causing the battery to be disconnected from the converter as described in detail below.

Converter 228 supplies +5 volts, +12 volts and −28 volts on lines 78. It also outputs a signal FULLPWR when the converter is putting out full power to the computer, which signal is inputted into PSM 28 for monitoring such condition. Converter 228 also outputs an analog load signal VCOMP that is fed into an A/D port of PSM 28 for determining the power load being used or consumed in the system. Converter 228 is turned on and off by a signal PSEN from PSM 28. Converter 228 will be shut down due to an overcurrent or an overvoltage condition on line +5, or a short circuit on the +12 volt line. A thermal sensor 229 protects against overthermal condition during operation of converter 223 and inputs a temperature signal TSENSE to PSM 28 for monitoring such condition.

PSM 28 is connected to power control logic 204 through lines 250-253 for respectively transmitting therebetween a WAKE signal, a power on PCON signal, an EXTSRC signal indicating connection to an external source, and a MAINNOK signal. PSM 28 also receives a FAULT signal from charger 230 when a charging fault occurs. PSM 28 also receives power management signals -FULLPDN and SIGWAKEUP. The -FULLPDN indicates that the computer is going into it suspend state and will be drawing low power, such signal being used by the PSM to enter its low power state. The SIGWAKEUP signal is used to awaken the PSM from a sleep state to allow communication to occur. The PWRCLK and PWRDATA signals are the clock and data signals previously discussed for communicating with SP 24.

BATTERY MONITOR

Figure 4:
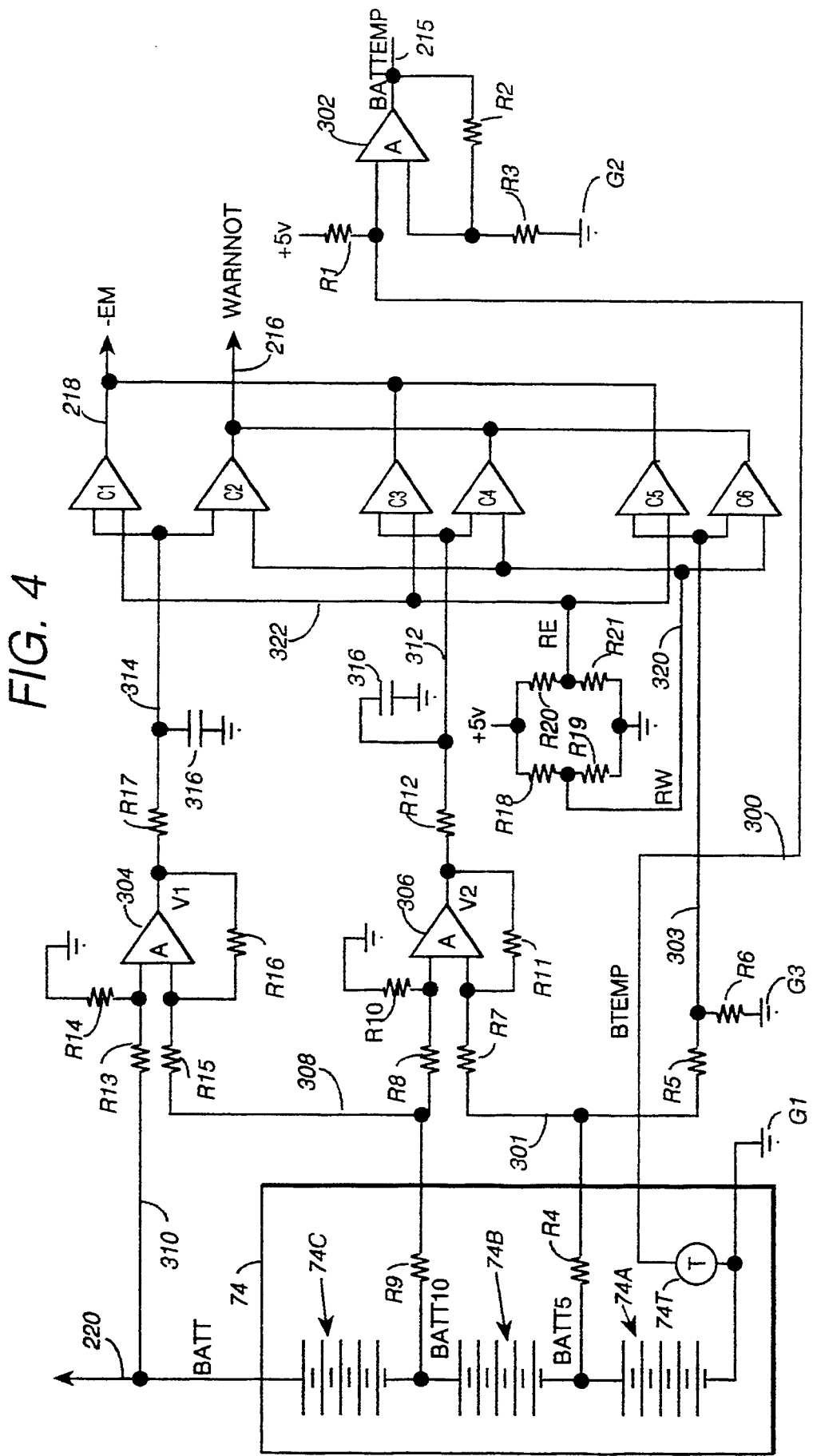
FIG. 4 is a block diagram illustrating the battery monitor.

With reference to FIG. 4, the BTEMP signal from thermistor 74T is transmitted along line 300 to one input of an operational amplifier or op amp 302. The thermistor is inside the battery and provides a resistance that is a function of temperature. Thermistor 74T is connected to ground G1 and to resistor R1 to form a resistor divider circuit that is powered by an input signal of +5 v. The other input of amp 302 is connected to ground G2 through resistor R3, and a resistor R2 is connected in parallel with amp 302. The signal BTEMP is amplified in op amp 302 by a factor of three to generate a signal BATTEMP that is fed on line 215 to PSM 28 allowing such processor to monitor battery temperature.

The BATT5 signal is fed through a resistor R4 to resistors R5 and R7 on line 301. Resistor R5 is connected to ground G3 through resistor R6 on line 303 to inputs of comparators C5 and C6. Resistor R7 is further connected to an input of op amp 306 that has a second input connected to resistors R8 and R10. Resistor R10 is grounded. Resistor R8 is connected to a line 308 which receives BATT10 signal through a resistor R9. Line 308 is further connected to a resistor R15 which is connected to an input of op amp 304. The other input of amp 304 is connected to resistors R13 and R14, the latter being grounded while the former is connected by line 310 to receive the BATT signal from battery 74.

The output of amp 306 is connected through resistor R12 to line 313 that is connected to inputs of comparators C3 and C4. Resistor R11 is connected in parallel with amp 306 between resistor R7 and the output of the amplifier. Line 312 is connected to a grounded capacitor 316 which reduces line noise. Similarly, the output of amp 304 is connected through resistor R17 to line 314 that is connected to inputs of comparators C1 and C2. Resistor R16 is connected in parallel with amp 304 between resistor R15 and the output of the amplifier. Line 314 is also connected to a grounded capacitor 316.

A voltage divider network comprising resistors R18-R21 is connected to receive a power signal of +5 v between resistors R17 and R20. Resistor R17 is connected to ground through resistor R19 and to a line 320 that outputs from the network a reference voltage RW that is fed to inputs of comparators C2, C4, and C6. Resistor R20 is connected to ground through a resistor R21 and to a line 322 that outputs a reference voltage RW to comparators C1, C3 and C5.

Operational amplifier 304 is configured to generate an output voltage, V1, that is proportional to the difference in the voltages BATT and BATT10. Operational amplifier 306 is configured to generate an output voltage, V2, that is proportional to the difference in the voltages BATT10 and BATT5. The voltages V1 and V2 are compared to two reference voltages, RE and RW by comparators C1, C2, C3, and C4. The reference signal RW is set to 3.11 and causes the signal WARNNOT on line 216 to go to a logic 0 when the voltage across any bank of 5 cells falls below 5.65 volts which equates to 1.13 volts per cell. The reference signal RE is set to 2.74 and causes the signal -EM on line 218 to go to a logic 0 when any group of 5 cells falls below 5 volts or 1 volt per cell. Comparators C5 and C6 are ground referenced eliminating the need for a third difference amplifier.

The various resistors illustrated perform different functions. Resistors R2 and R3 set the voltage gain of op amp 302. The signal BTEMP may be too low to accurately measure and R2 and R3, when having values of 100k ohms and 50k ohms produce a gain of three. Resistors R9 and R4 provide safety protection to insure that high currents cannot occur. Resistors R13–R16, and R8–R10 set output voltage V1 indicating a warning (through WARNNOT) at 1.13 volts/cell and a shutoff (through -EM) at 1.0 volts/cell for battery bank 74C. Resistors R5–R11, and R13–R15 program battery bank 74B for the same 1.13 and 1.0 volts per cell. Resistors R5 and R6 program bank 74A for the same 1.13 and 1.0 volts/cell. Resistors R18 and R19 form a comparison voltage RW for warning protection. Resistors R20 and R21 form a comparison voltage RE used for emergency shutoff protection. Resistors R17 and R12 and capacitors 316 provide noise filtering to insure that the battery monitor does not act on any noise present.

Figure 5:
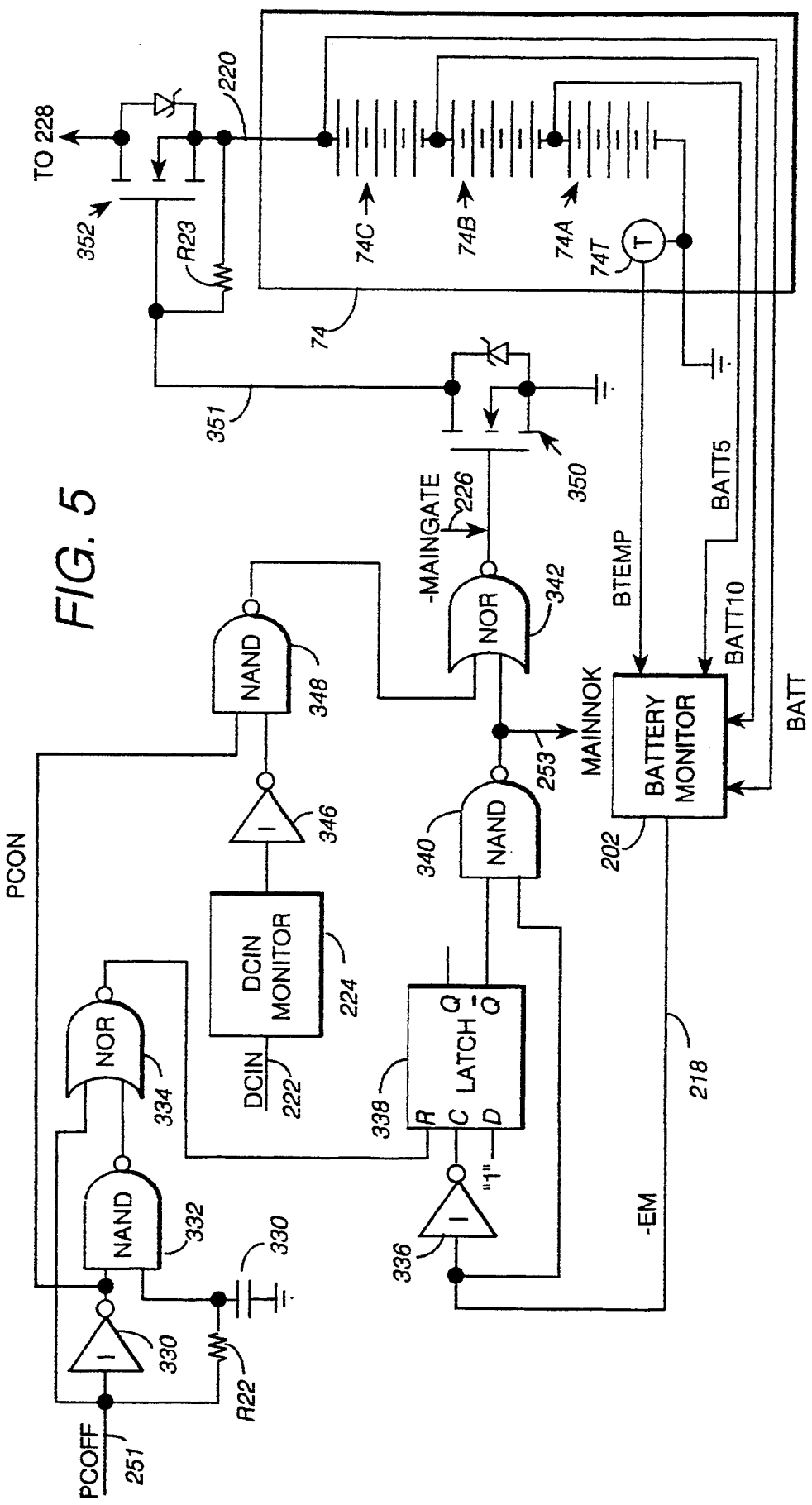
FIG. 5 is a block diagram illustrating the cell reversal protection circuit.

Cell reversal in nicad batteries is caused by excessive discharge of one of the battery cells. Deep discharge of a cell can cause venting of the cell safety device and will result greatly decreased cell life. To prevent this from occurring, the circuit shown in FIG. 5, isolates battery 74 from DC/DC converter 228 (FIG. 3) whenever the battery monitoring circuit detects that a battery bank has been depleted.

Prior to use of the battery, battery processor 28 exerts a logic 0 on the PCOFF signal line 251. Line 251 is connected to the input of an invertor 330 whose output if fed to one input of a two input NAND gate 332. Gate 332 has another input connected through resistor R22 to line 251. The output of gate 332 is connected to an input of NOR gate 334 whose output is connected to the reset input (R) of latch 338. The logic 0 input (PCOFF) results in a positive pulse at the output of NOR gate 334, the width of the pulse being programmed or predetermined by the RC time constant of resistor R22 and capacitor 330. The output of invertor 336 is connected to the clock input (C) of latch 338. Latch 338 also has a data input (D) set to a logic "1" state. The purpose of the positive pulse from gate 334 is to reset latch 338 and thereby produce a hi signal on output not Q of latch 338. Such output is connected to one input of a NAND gate 340 having another input connected to line 218. The output of gate 340 is connected to an input of NOR gate 342 and to line 253 to produce the MAINNOK signal. MAINNOK goes to a high state if the -EM signal goes low, and remains in such state until cleared by the PSM. Typically, once -EM occurs (battery empty), the battery is disconnected causing -EM to revert to the state indicating a usable battery. The output of gate 342 is connected to the gating input of a field effect transistor (FET) 350. A second FET 352 has a gating input connected to FET 350. FET 352 has a source and drain inputs connected to battery 74 via line 220 and to converter 228 whereby the connection of the battery to the converter is controlled by FET 352, which in turn is controlled by FET 350, which in turn is controlled by gate 342. When the output of gate 342 is at logic 1, battery 74 is connected to DC/DC converter 228 through FET 352. When the output of gate 342 is at a logic 0, the battery is disconnected from the DC/DC converter.

Monitor 224 has an output connected to an invertor 346 which in turn is connected to an input of a two input NAND gate 348. Invertor 346 and gate 348 are provided to insure that the battery is never used to power the machine when a valid external power source is available. The output of gate 348 is connected to the second input of NOR gate 342. When computer 10 is connected to an external power source, DCIN is positive (hi), the output of monitor 338 is high, the output of gate 348 is low, and the output of gate 342 is low. Thus, FET 350 is turned off. This action has the effect of disconnecting battery 74 from converter 228. When the computer is not connected to the external power source, DCIN is negative thus enabling gate 348 to produce a low output when the PCOFF signal is received. Such signal is inverted by 330 and inputted to gate 348 whereby the conjunction of such hi signal and a hi signal from 346 produces a low output from 348 thereby producing a low output from 342 placing the output of gate 342 under the control of latch 338. When latch 338 is reset as described above, it produces a hi output at one input of gate 340. The other input of 340 is connected to line 218 which is normally hi when none of the battery bank voltages is at or below the cutoff value. FET 350 is turned on initially when the PSM activates PCOFF. This causes the latch to get a reset pulse from 334. If the battery monitor indicates a usable battery by -EM, then the latch remains reset. If a DCIN is not present indicated by 224, then signal 226 is placed in a one state forcing signal 351 to a low state, allowing use of the battery. Two FETs are used because the battery voltage appears on signal 351 when 350 is off. The battery voltage is greater than 15 volts dc which would cause normal logic gates to breakdown. Thus a high voltage device 350 controls high current device 352.

In summary, when DTC 10 is turned on and is operating under battery power, latch 338 is reset or armed, and FETs 350 and 352 are turned on thus connecting battery 74 to converter 228. When the voltage across any of battery banks hits 5.0 volts or less, the battery monitor exerts a logic 0 (-EM) signal which is fed on line 218 to the input of invertor (I) 336. This signal sets latch 338 causing the output of NOR gate 342 to go to a logic 0 state. FET 350 is of the N-channel MOSFET variety and will sink current through R23 whenever its gate is a threshold (logic 1) above ground. FET 352 is of the P-channel variety such that whenever its gate is below its source by a threshold, current can flow from its source to drain. When the latch is set by the -EM signal falling, FET 350 is turned off allowing the gate of FET 352 to be pulled up by R23 forcing FET 352 off.

Latch 338 insures that at the first instance of low battery, the DC/DC converter is disconnected. Because of the internal resistance of battery 74, its voltage is higher when measured without a load. Without latch 338, the battery voltage would rise when the DC/DC converter is disconnected causing the battery monitor to falsely report a good battery. This would cause the battery to be reconnected to the DC/DC and the cycle would repeat.

For safety purposes, it is important that a nicad cell not have current flow through it when its cell voltage falls below zero volts. This condition could occur when one cell in a bank of cells becomes depleted while the other cells have remaining charge. To prevent this from occurring, two precautions should be taken. First, the cells should be matched to insure that no two cells have radically different capacities. Second, the user must prevent the pack from being used after it is depleted.

The typical method for cutting off the use of the pack is to measure the output voltage of the total string of cells and discontinue use after the voltage drops below a certain level. For packs with a low number of cells, the recommended cutoff point is 1.0 volt per cell if the circuit measures the total pack voltage. When the number of cells increases, the manufacturers recommend that the cutoff voltage per cell be increased from 1.0 to 1.1 volts. Thus in the case of battery 74 (a 15 cell battery), battery manufacturers recommend a 16.8 volt cutoff limit using entire pack voltage for cutoff measurement.

Figure 6A:
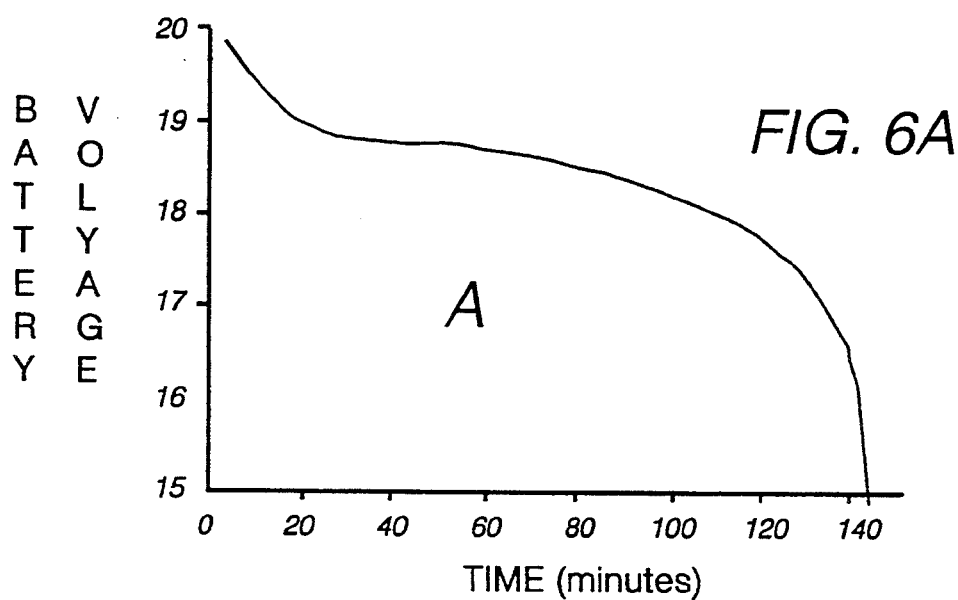
FIGS. 6A–6C show graphs useful in understanding certain aspects of the invention.
Figure 6B:
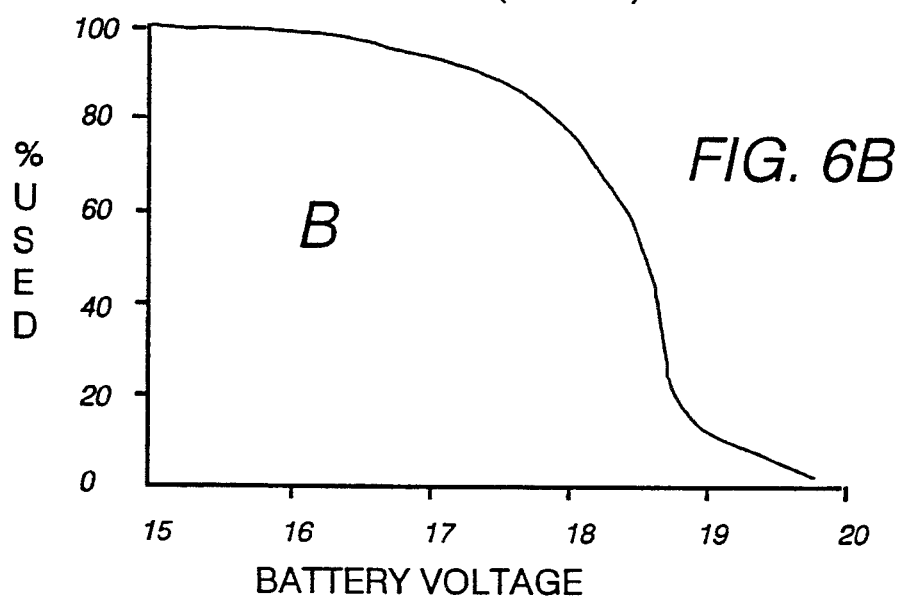
Figure 6C:
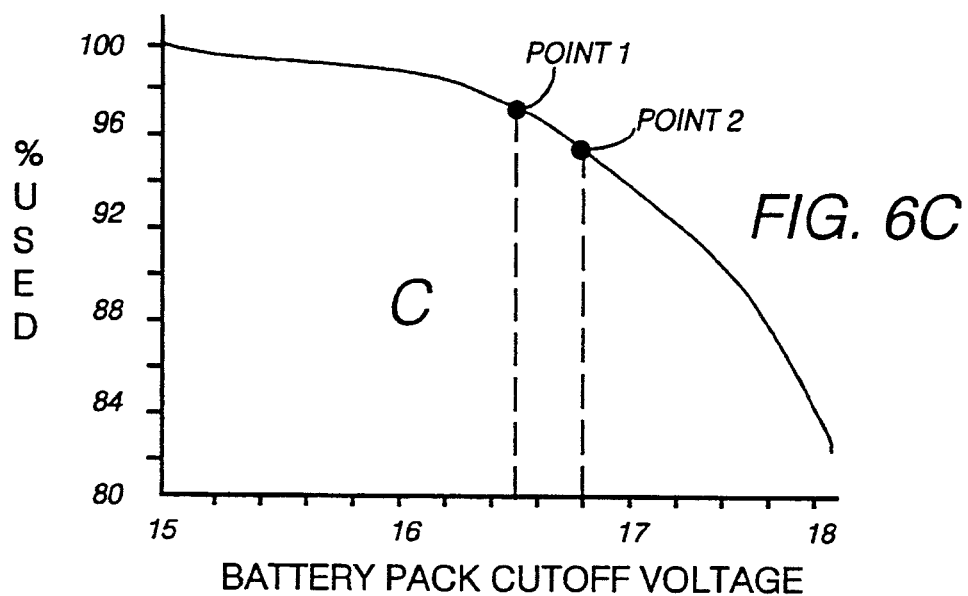

In FIGS. 6A–6C, the graphs were obtained by discharging a typical fifteen cell battery at 500 ma at 25 degrees C. The battery in this case yielded a total of 22.1 watt-hours of power when cutoff off at 15 volts. Graph A shows the voltage versus time relationship. Graph B shows the per cent of fuel used versus battery voltage. By selecting a cutoff voltage on the X-axis the available percentage of fuel can be determined from the reading of the Y-axis. This graph can be used to determine how much power would be unused for various cutoff voltages. Graph C is similar to graph B except with different axis limits so that the amount of fuel used can be more accurately read. Point 1 on curve C represents a cutoff voltage of 16.5 volts and point 2 represents a cutoff voltage of 16.8 volts. For a battery pack cutoff voltage of 16.5, there is approximately 0.53 watt hours of additional power available whereas at point 2, there is 0.90 watt hours of energy left. To get additional life from the battery, the battery taps bring out the voltage of the fifth and tenth cell. By thus monitoring groups of five cells, and using a bank cutoff voltage of 5.5 volts, the invention is able to get 0.37 additional watt hours of power from the battery than would be gotten following manufacturers recommendations.

SP 24 computes the charge left in the battery, the charge needed to save system state, and extend operation by the difference. The WARNNOT signal gives more time than is required to save system if the battery was more than half charged at the time system power is turned on. The SP issues a PCUINT which informs system to save its state. The system then saves its state and issues zero power command.

It should be apparent to those skilled in the art that many changes can be made in the details and arrangements of steps and parts without departing from the scope of the invention as defined in the appended claims.

What is claimed is:

1. A battery-operated, portable computer comprising:
    a battery connected to said computer for supplying electrical energy to operate said computer, said battery comprising a plurality of battery banks connected in series, each bank comprising a like number of matched battery cells connected in series;
    voltage monitoring means connected to said banks for measuring respective bank voltages across each of said banks during operation of said computer, said voltage monitoring means comprising first means for generating a low battery warning signal when the bank voltage across any one of said banks drops below a predetermined first value corresponding to a battery charge level allowing said computer to save volatile data and power down under program control, said voltage monitoring means further comprising second means for generating a cutoff signal when the bank voltage across any one of said banks drops below a predetermined second value lower than said first value, said second value corresponding to a voltage level below which cell polarity reversal is eminent;
    shutdown means connected to said monitoring means for receiving said warning signal and, in response thereto, initiating saving volatile data and powering down said computer; and
    cell reversal protection circuit means connected to said monitoring means for receiving said cutoff signal and, in response thereto, immediately disconnecting said battery from said computer to prevent cell polarity reversal from occurring.

2. A computer in accordance with claim 1 comprising:
    a DC to DC converter connected to said battery for converting power from said battery into different voltages for operating components of said computer;
    said cell reversal protection circuit means including switch means between said battery and said converter for disconnecting said converter from said battery in response to said cutoff signal.

3. A computer in accordance with claim 2 wherein:
    said battery comprises rechargeable nickel cadmium cells arranged with n cells per bank;
    said first value of bank voltage equals n multiplied by 1.3 volts per cell;
    and said second value of bank voltage equals n multiplied by 1.0 volts per cell.

4. A computer in accordance with claim 2 comprising:
    a power subsystem comprising said battery, said monitor, and a power subsystem microcontroller (PSM), said PSM having an interrupt request line connected to said monitor for receiving said low battery warning signal and interrupting operation of said PSM in response to said low battery warning signal.

5. A computer in accordance with claim 4 comprising:
    a main microprocessor
    a plurality of system components including a volatile main memory operated under control of said main microprocessor for storing said volatile data, and a non-volatile memory for storing said volatile data saved by said shutdown means;
    a power distribution system (PDS) connected to said power subsystem and to said system components for supplying power from said power subsystem to said components, said PDS comprising a plurality of switches selectively operable in response to control signals from said main microprocessor to selectively power up and power down said components;

and third means operable in response to interruption of said PSM by said low battery warning signal to signal main microprocessor to operate said plurality of switches and power down said components to thereby shutdown operation of said computer.

6. A computer in accordance with claim 5 wherein said third means comprises a service processor connected to said main processor and to said PSM, said PSM being operable in response to being interrupted by said low battery warning signal to set a flag in a data packet and transmit such packet to said service processor, said service processor being operable in response to receiving said packet to generate an interrupt request and send such request to said main processor.

7. A computer in accordance with claim 6 wherein said service processor includes a power state register settable by said PSM in response to receiving said data packet, to indicate cause of such interrupt, said host being operative to read said power state register to determine the cause of such interrupt.

8. A computer in accordance with claim 1 wherein said voltage monitoring means comprises:
fourth means for generating first and second reference signals corresponding respectively to said first value and to said second value; and
comparator means connected to said fourth means to receive said first and second reference signals, said comparator means being further connected to receive said bank voltages and operative to compare said bank voltages with said first and second reference signals and generate said low battery warning signal and said cutoff signal in response to such comparisons.

9. A computer in accordance with claim 8 wherein said cell reversal protection circuit means further comprises a latch connected to receive said cutoff signal and set said latch in response thereto, said switch means being operable under control of said latch to turn off said switch means when said latch is set.

10. A computer in accordance with claim 9 wherein said switch means comprises:
a first electronic switch connected between said battery and said converter for controlling the supply of battery power to said converter;
and a second electronic switch having a first connection to said first switch for controlling actuation of said first switch and a second connection for controlling actuation of said second electronic switch.

11. A computer in accordance with claim 10 comprising:
gate means having an output connected to said second electronic switch and first and second inputs, said first input being connected to said latch;
and monitoring means connected to said second input of said gate means for disabling said gate means when said computer is connected to an external source of dc power, to thereby disconnect said battery.

* * * * *